United States Patent
Hwu et al.

(10) Patent No.: US 8,338,851 B2
(45) Date of Patent: Dec. 25, 2012

(54) MULTI-LAYER LED ARRAY ENGINE

(75) Inventors: Jon-Fwu Hwu, Hsinchu (TW); Yung-Fu Wu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 511 days.

(21) Appl. No.: 12/725,462

(22) Filed: Mar. 17, 2010

(65) Prior Publication Data

US 2011/0227105 A1 Sep. 22, 2011

(51) Int. Cl.
*H01L 33/00* (2010.01)

(52) U.S. Cl. ............... 257/99; 257/88; 257/91; 257/98; 257/690; 257/710

(58) Field of Classification Search .......... 257/79, 257/88, 91, 98–100, 690, 710

See application file for complete search history.

(56) References Cited

U.S. PATENT DOCUMENTS

| 7,161,189 | B2 * | 1/2007 | Wu | 257/98 |
| 7,709,857 | B2 * | 5/2010 | Kim et al. | 257/100 |
| 2005/0269587 | A1 * | 12/2005 | Loh et al. | 257/99 |
| 2006/0102917 | A1 * | 5/2006 | Oyama et al. | 257/99 |
| 2010/0314654 | A1 * | 12/2010 | Hayashi | 257/99 |

* cited by examiner

*Primary Examiner* — Ori Nadav
(74) *Attorney, Agent, or Firm* — Lin & Associates IP, Inc.

(57) ABSTRACT

A multi-layer LED array engine is provided. The multi-layer LED array engine includes a base plate frame, a molded platform, two lead frames, a lighting element, a dome, a protection layer, and a phosphorous layer. The molded platform is disposed on and secured to the base plate frame. The two lead frames are combined with two lead frame grooves of the base plate frame. The lighting element is disposed on a lighting area of the base plate frame. The protection layer is provided on the lighting element, and the phosphorous layer is provided on the protection layer. The dome is secured to the molded platform for covering the molded platform and the lighting element.

19 Claims, 7 Drawing Sheets

MULTI-LAYER LED ARRAY ENGINE

BACKGROUND OF THE INVENTION

1. Field of the Invention

The present invention relates generally to a multi-layer light emitting diode (LED) array engine. The multi-layer LED array engine can be fabricated by a very simple manufacturing process with a low manufacturing cost and a short manufacturing cycle time.

2. The Related Arts

Generally, an LED emits light in accordance with the intrinsic characteristic of the solid state semiconductor of the LED. Differing from the light emitting principle of the filament light bulb, an LED emits light when a current flows to the semiconductor PN junction, and does not need to be heated to a high temperature. As such, LEDs are also known as cold light sources. LEDs typically have the advantages including better durability, longer lifespan, lower weight, and lower power consumption. Particularly and more importantly, LEDs do not contain poisonous materials, e.g., mercury or poisonous gases. Therefore, LEDs are often used in form of a secondary assembly of LED array assembled on a printed circuit board (PCB) and have been widely employed for illumination purpose in a variety of fields, such as electronic display boards, or electronic traffic signs.

Typically, a lead frame strip is often used in assembling an LED array, in which each LED is wire bonded and molded to form an LED die. Each LED die is assembled to a lead frame pocket, and the bonded wire connects the LED die with a lead of the lead frame. The LED die and a part of the lead frame are packaged and molded to form an LED unit having external leads for electrical connection.

An LED array includes a plurality of such packaged LED units surface mounted on a pre-designed PCB or a ceramic substrate, in an array form. Such architecture is also known as a secondary level assembly of LED units. This architecture may be applied in the fields of electronic display boards or electronic traffic signs. However, according to the secondary level assembly architecture, the size of the LED products is restricted by the packaged LED unit, since the size of the packaged LED unit is much larger than the size of the die. Further, although not much, LEDs generate heat when emit light, and the only way of dissipating the generated heat in this specific architecture is from the leads to the metal lead frames. However, the leads are usually too thin to be good enough for dissipating the heat generated thereby.

According to another conventional multi-layer LED array engine, a plurality of LED dice are provided directly onto a pre-designed PCB. Specifically, the PCB is configured with circuits corresponding to the LED dice. The LED dice are electrically connected to the circuits of the PCB by bonded wires or bumps. And then, a silicon gel is used to seal the entirety of the LED array onto the PCB to form a package.

As discussed above with respect to the conventional technologies, the PCB also serves as the substrate of the multi-layer LED array. However, a PCB is usually fabricated by many complicated processes including lithographing, stamping, drilling, and plating copper in through holes. Therefore, the application of PCB as the substrate for the multi-layer LED array is not flexible, since once the PCB is prepared, it cannot be conveniently modified. As such, each multi-layer LED array must be provided with a PCB specifically designed corresponding thereto. As to the LED array, what is needed for lighting up the LED array is a loop electrically connecting thereto and supplying a current thereto. When being further provided with a heat dissipation device, the LED array can achieve a certain light emitting performance during a certain life span. Therefore, it is very much desired to provide a multi-layer LED array while simplifying the operation process and saving production cost and time thereof.

SUMMARY OF THE INVENTION

Accordingly, a primary objective of the present invention is to provide a multi-layer LED array engine having a multi-layer architecture. The multi-layer architecture of the LED array is simple and adapted for simplifying the operation process and saving production cost and time thereof.

Another objective of the present invention is to provide a multi-layer LED array engine. The multi-layer LED array engine includes an LED array arranged at a center of a base plate frame in accordance with practical application. The LED array includes a plurality of LED dice distributed in an array form. The LED dice can be electrically coupled in parallel or in serial according to the design of the multi-layer LED array engine of the present invention. In such a way, even when one or more LEDs in the LED array are damaged, the entire lamination of the multi-layer LED array still remains uniform.

For achieving the foregoing objectives and others, the present invention provides a multi-layer LED array engine. The multi-layer LED array engine includes a base plate frame, a molded platform, two lead frames, a dome, a light element, a protection layer, and a phosphorous layer.

The base plate frame includes a lighting area and two lead frame grooves. In accordance with a top view of the base plate frame, the base plate frame has a front side, a rear side, a left side, a right side, and a center. The lighting area is adapted for securing a plurality of LED dice thereto. The lighting area is located at the center of the base plate frame. The two lead frame grooves are distributed at the front side and the rear side, respectively at an upper surface of the base plate frame, for electrically connecting with the two lead frames. The base plate frame is configured with at least one first locking hole and at least two through holes at each of the left side and the right side. The first locking hole is adapted for securing the molded platform to the base plate frame. The through holes are adapted for mounting the LED dice on the base plate frame. The first locking hole includes a protruded edge configured on an inner wall of the first locking hole. A diameter of the first locking hole at the protruded edge is smaller than a diameter at elsewhere of the first locking hole. The base plate frame is further configured with at least two dented grooves at an edge of a bottom side of the base plate frame corresponding to each of the two lead frame grooves. The two dented grooves are spaced one from another.

The molded platform is configured by conducting an injection molding process on the base plate frame surrounding the center of the base plate frame on which the LED dice are to be secured. An upper part of the molded platform which is higher in height than the lighting area is defined as a top molded platform. The top molded platform includes a front protruded plate and a back protruded plate. The front protruded plate and the back protruded plate are correspondingly positioned in accommodating spaces defined in the two lead frame grooves, respectively. Each of the front protruded plate and the back protruded plate is configured extending beyond the corresponding lead frame groove. At a far end of each of the front protruded plate and the back protruded plate, each of the front protruded plate and the back protruded plate further extends downwardly and configures a first protruded part thereby. The first protruded part then extends parallel with an upper surface of the top molded platform and back towards to the center of the base plate frame, and configures a protruded block thereby. The protruded blocks are adapted for being correspondingly assembled to the dented grooves. The top molded platform further includes a second protruded part positioned corresponding to the first locking hole. The second protruded part is adapted for being correspondingly assembled to the first locking hole of the base plate frame. The top molded platform includes a top flat surface, an internal surface, a locking surface and an optical reflective surface. The top flat surface is a flat surface portion positioned at an upper side and a periphery of the top molded platform. The top flat surface includes an inner edge coupled to the internal surface of the top molded platform. The internal surface is substantially perpendicular with the top flat surface. The internal surface includes a bottom edge coupled to the locking surface of the top molded platform. The bottom edge of the internal surface is substantially perpendicular to the locking surface. The locking surface is parallel to the top flat surface.

A dome embedded groove is configured at the locking surface. The optical reflective surface is positioned around and adjacent to the center with an inclined angle in a range of 30° to 60°. The optical reflective surface includes an innermost edge, and the inner edge of the optical reflective surface is joined with a phosphorous wall configured with an inclined angle in a range of 30° to 60° relative to the lighting area.

In some certain circumstances, very high power LED application may be desired, and correspondingly according to an aspect of the present invention, the phosphorous wall and the optical reflectivity surface are sputtered with a nickel or chromium coating. Or alternatively, a metal reflector cap plated with a nickel or chromium coating is provided on the phosphorous wall and the optical reflectivity surface for improving the light reflectivity of the multi-layer LED array engine. Each lead frame includes an inner end, a center part, and an outer end. The center part of each lead frame for wire bonding is sealed inside the protruded plate. The inner end of the lead frame at the lighting area is adapted for internal electrical connection and the outer end of the lead frame is adapted for external electrical connection. Each lead frame 5 is further configured with at least one second locking hole and at least one second locking-in groove between the inner end and the outer end. The second locking-in groove and the second locking hole are buried and sealed inside the molded platform. However, the inner end of the lead frame and the outer end of the lead frame are reserved unsealed by the molded platform for wire bonding and electrical connection. A plurality of holes are configured at the outer end of the lead frame for electrical connection with external components. The outer end of the lead frame is configured extending out beyond the peripheral edge of the base plate frame for external electrical connection.

The dome is a transparent silicon lens formed by executing an injection molding process on the molded platform for covering and protecting the light element. The dome includes an extended plug and a protruded stick configured at a bottom edge of the dome. The extended plug is configured extending outwardly. The protruded stick is configured beneath the extended plug for correspondingly engaging with the dome embedded groove of the molded platform.

The lighting element is disposed on the upper surface of the lighting area of the base plate frame. The lighting element includes a plurality of LED dice, all of which are wire bonded together and wire bonded to the inner end of the lead frame to form a complete loop of electrical circuit. The protection layer is a thin layer of transparent silicon epoxy coated on the wire bonded LED dice for providing a protection to the LED dice. The phosphorous layer is disposed on the protection layer.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
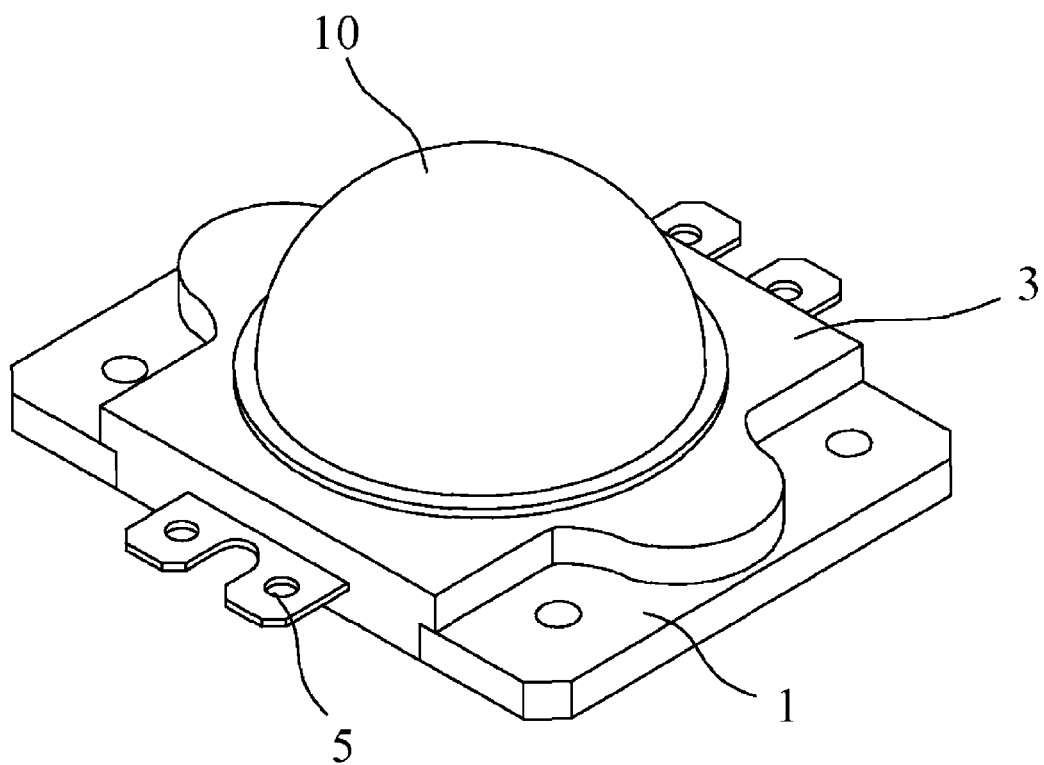
FIG. 1 is a perspective view of a multi-layer LED array engine according to an embodiment of the present invention.

The accompanying drawings are included to provide a further understanding of the invention, and are incorporated in and constitute a part of this specification. The drawing illustrates embodiments of the invention and, together with the description, serves to explain the principles of the invention.

Figure 2:
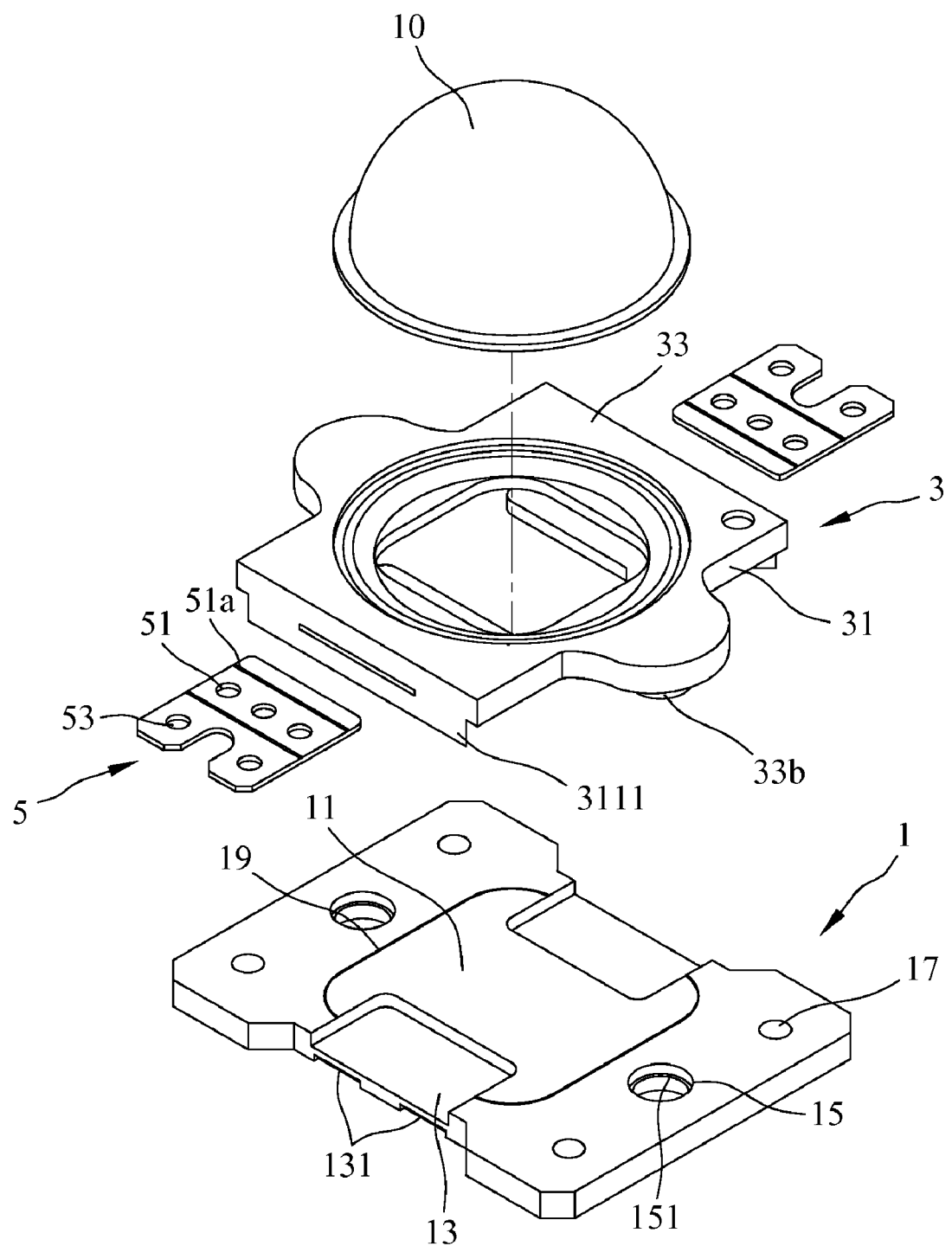
FIG. 2 is an exploded view of the multi-layer LED array engine according to an embodiment of the present invention.
Figure 3:
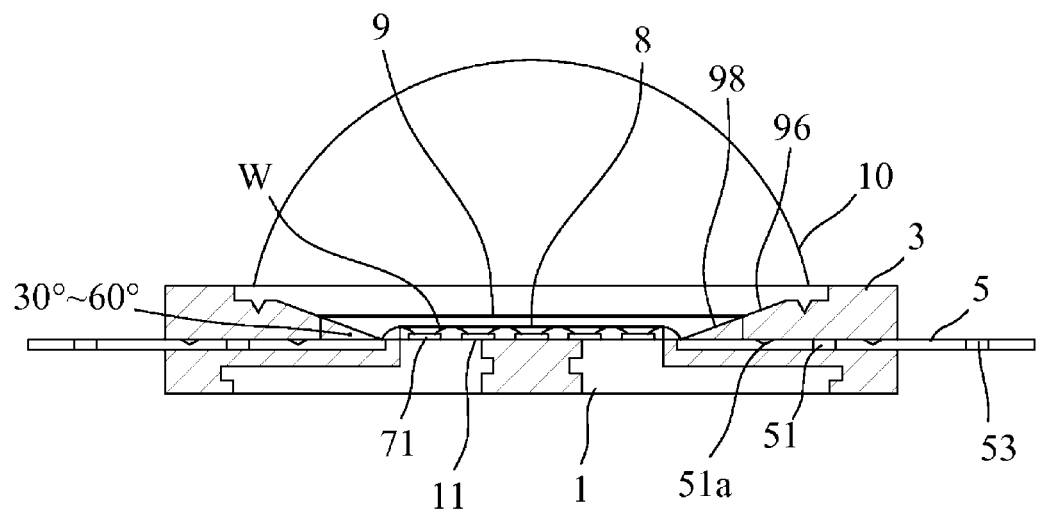
FIG. 3 is a cross-sectional view of the multi-layer LED array engine according to an embodiment of the present invention.

FIG. 1 is a perspective view of a multi-layer LED array engine according to an embodiment of the present invention. FIG. 2 is an exploded view of the multi-layer LED array engine according to an embodiment of the present invention. FIG. 3 is an exploded cross-sectional view of the multi-layer LED array engine according to an embodiment of the present invention.

Referring to FIGS. 1 through 3, there is shown a multi-layer LED array engine. The multi-layer LED array engine includes a base plate frame 1, a molded platform 3, at least one lead frame 5, and a dome 10.

The base plate frame 1 includes at least one lighting area 11 and two lead frame grooves 13. As shown in FIG. 2, viewing from a top side, the base plate frame 1 has a front side, a rear side, a left side, a right side, and a center. The lighting area 11 is located at the center of the base plate frame 1. A first locking groove 19 is configured surrounding the lighting area 11. The two lead frame grooves 13 are configured at the front side and the rear side of the base plate frame 1 and are positioned at two opposite sides of the lighting area 11, respectively. The base plate frame 1 is further configured with at least two rectangular shaped dented grooves 131 at an edge of a bottom side of the base plate frame 1 corresponding to each of the two lead frame grooves 13. The two dented grooves 131 are spaced one from another. The base plate frame 1 is configured with at least one first locking hole 15 and at least one through hole 17 at each of the left side and the right side adjacent to the lighting area 11. A protruded edge 151 is configured on an inner wall of the first locking hole 15. Or alternatively, as shown in FIG. 2, the base plate frame 1 is configured with one first locking hole 15 and two through holes 17 at each of the left side and the right side of the base plate frame 1. The two through holes 17 are positioned at two lateral sides of the first locking hole 15 or at the corners of the left side and right side. The base plate frame 1 can be made of a material selected from the group consisting of copper (Cu), aluminum (Al), Cu alloy, Al alloy. The base plate frame 1 and the lighting area 11 can be plated with nickel (Ni), silver (Ag) or other suitable material (not shown in the drawings).

Figure 4:
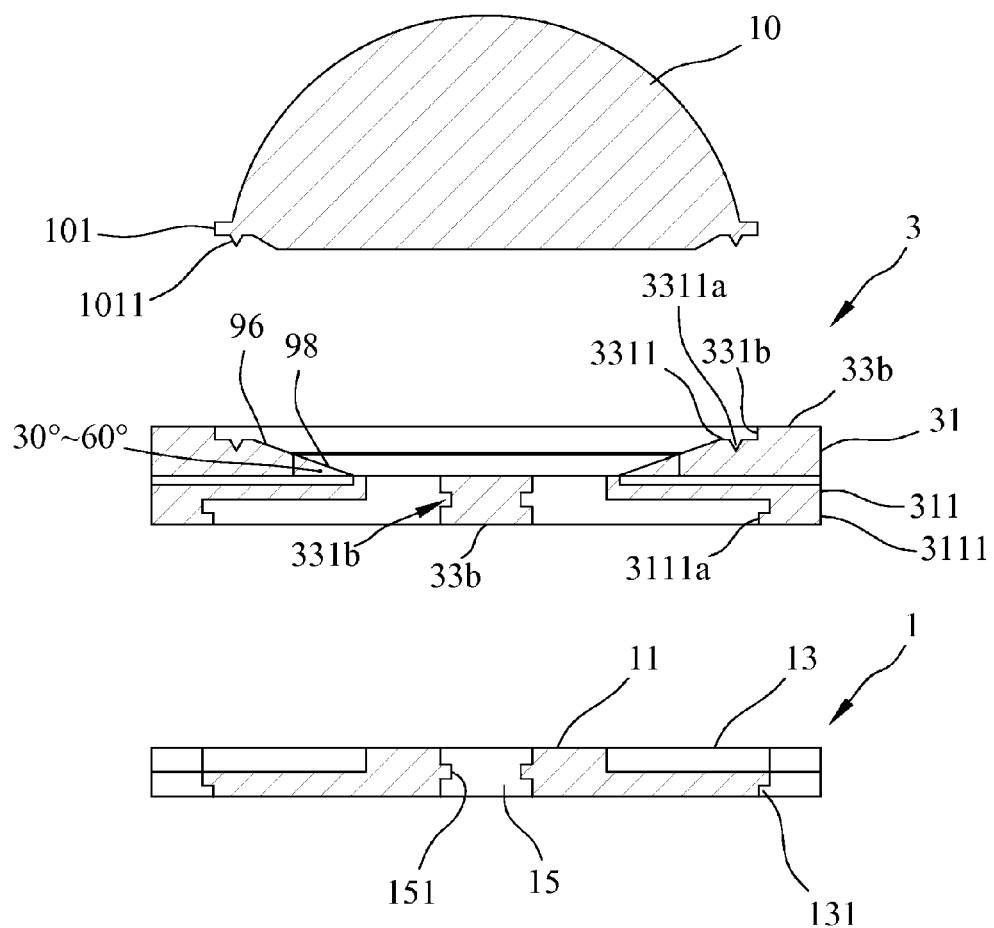
FIG. 4 is an exploded cross-sectional view of the multi-layer LED array engine according to an embodiment of the present invention.

FIG. 3 is a cross-sectional view of the multi-layer LED array engine according to an embodiment of the present invention. FIG. 4 is an exploded cross-sectional view of the multi-layer LED array engine according to an embodiment of the present invention. As shown in FIGS. 3 and 4, the molded platform 3 is disposed on the base plate frame 1, and the dome 10 is disposed on the molded platform 3. Preferably, the molded platform 3 is firmly molded and fixed onto the base plate frame 1 by executing an injection molding process. An upper part of the molded platform 3 which is higher in height than the lighting area 11 is defined as a top molded platform 31. It should be noted that the top molded platform 31 is identified for illustration purpose only, and the top molded platform should be understood as a part of, rather than detached from, the molded platform 31.

The top molded platform 31 further includes two protruded plates 311 configured at a bottom thereof. The two protruded plates 311 are distributed at two opposite sides of the top molded platform 31 corresponding to the front side and the rear side of the base plate frame 1, and are defined as a front protruded plate 311 and a back protruded plate 311, respectively. The protruded plates 311 are configured with a shape and size corresponding to the lead frame grooves 13, and are adapted to be matched therewith. Each of the front protruded plate and the back protruded plate 311 is configured extending beyond the corresponding lead frame groove 13. At a far end of each of the front protruded plate and the back protruded plate 311, each of the front protruded plate and the back protruded plate 311 further extends downwardly and configures a first protruded part 3111 thereby. The first protruded part 3111 then extends parallel with an upper surface of the top molded platform 31 and back towards to the center of the base plate frame 1, and configures a protruded block 3111a thereby. The protruded blocks 3111a are adapted for being correspondingly assembled to the dented grooves 131. The top molded platform 31 further includes a second protruded part 33b positioned corresponding to the protruded edge 151 of the first locking hole 15. The second protruded part 33b is adapted for being correspondingly assembled to the first locking hole 15 of the base plate frame 1. The second protruded part 33b is configured with a dented edge 331b. The dented edge 331b is adapted to be subsequently matched with the protruded edge 151 of the base plate frame 1.

Figure 6:
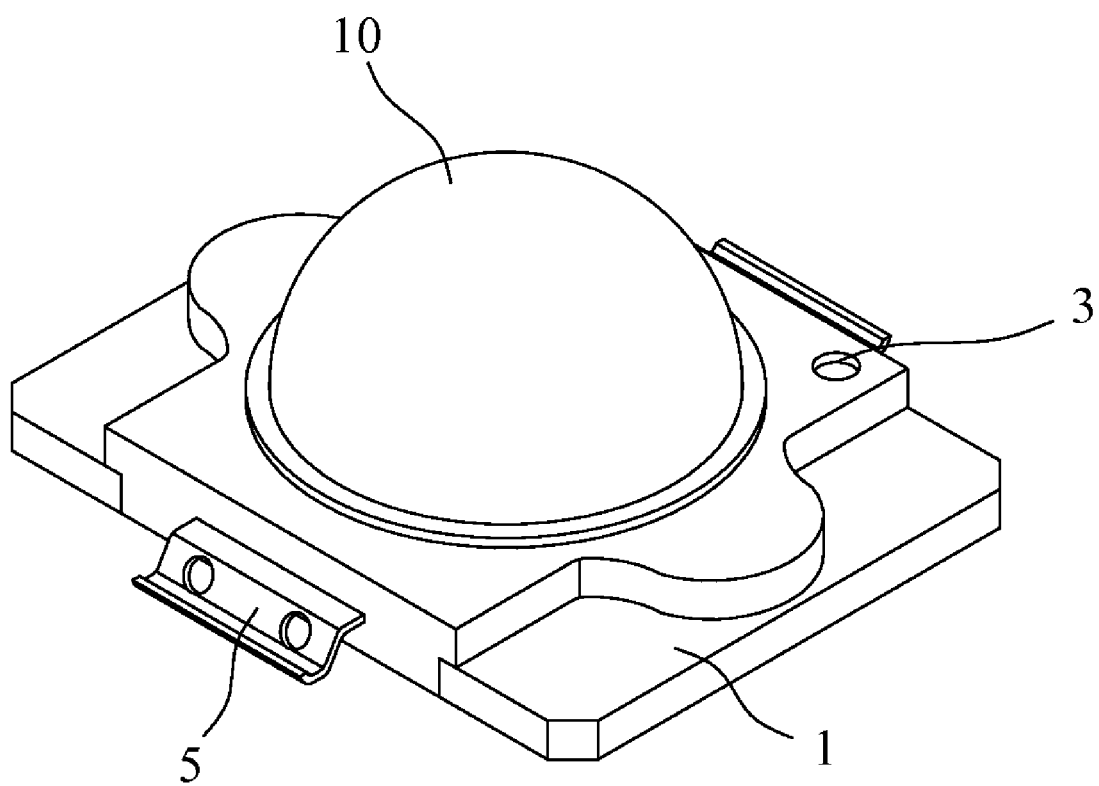
FIG. 6 is a perspective view of a multi-layer LED array engine according to another embodiment of the present invention.

As shown in FIGS. 3 and 4, each lead frame 5 includes an inner end, a center part, and an outer end. The center part of each lead frame 5 adapted for wire bonding is sealed inside the protruded plate 311. The inner end of the lead frame 5 at the lighting area 11 is adapted for internal electrical connection and the outer end of the lead frame 5 is adapted for external electrical connection. Each lead frame 5 is further configured with at least one second locking hole 51 and at least one second locking-in groove 51a between the inner end and the outer end of the lead frame 5. The second locking-in groove 51a and the second locking hole 51 are buried and sealed inside the molded platform 3. However, the inner end of the lead frame 5 and the outer end of the lead frame 5 are reserved unsealed by the molded platform 3 for wire bonding and electrical connection. An upper surface of the lead frame 5 is at least not lower than an upper surface of the lighting area 11. A plurality of solder holes 51 are configured at the outer end of the lead frame 5 for electrical connection with external components. However, it should be noted that the quantity of the second locking holes 51 and the solder holes 53 configured in the drawings is exemplified for illustration purpose only without restricting the scope of the present invention. FIG. 6 illustrates a lead frame of a multi-layer LED array engine according to another embodiment of the present invention.

The molded platform 3 is configured by executing an injection molding process, during which the molding compound completely fills up the first locking groove 19, the dented grooves 131, the first locking holes, and the lead frame grooves 13 of the base plate frame 1. In such a way, the protruded blocks 3111a, the dented grooves 131, and the protruded edge 151 corresponding to the dented edge 331b are interlocked and secured together. Further the molding compound also completely fills up the second locking-in grooves 51a and the second locking hole 51. In such a way, the base plate frame 1, the molded platform 3, and the lead frames 5 are solidly and firmly combined together into a whole. The first locking groove 19 and the second locking-in grooves 51a are preferably configured with a V-shaped cross-section, or any other suitable shape.

The top molded platform 31 includes a top flat surface 33, an internal surface 331, a locking surface 3311 and an optical reflective surface 96. The top flat surface 33 is a flat surface portion positioned at an upper side and a periphery of the top molded platform 31. The top flat surface 33 includes an inner edge coupled to the internal surface 331 of the top molded platform 33. The internal surface 331 is substantially perpendicular with the top flat surface 33. The internal surface 331 includes a bottom edge coupled to the locking surface 3311 of the top molded platform 31. The bottom edge of the internal surface 331 is substantially perpendicular to the locking surface 3311. The locking surface 3311 is parallel to the top flat surface 33. A dome embedded groove 3311a is configured at the locking surface 3311. The dome embedded groove 3311a for example has a V-shaped cross-section. The optical reflective surface 96 is positioned around and adjacent to the center with an inclined angle in a range of 30° to 60°. The optical reflective surface 96 includes an innermost edge, and the innermost edge of the optical reflective surface 96 is joined with a phosphorous wall 98 configured with an inclined angle in a range of 30° to 60° relative to the lighting area 11. In some certain circumstances, very high power LED application may be desired, and correspondingly according to an aspect of the present invention, the phosphorous wall 98 and the optical reflectivity surface 96 are sputtered with a nickel or chromium coating (not shown in drawings). Or alternatively, a metal reflector cap 99 plated with a nickel or chromium coating is provided on the phosphorous wall 98 and the optical reflectivity surface 96 for improving the light reflectivity of the multi-layer LED array engine.

Figure 5:
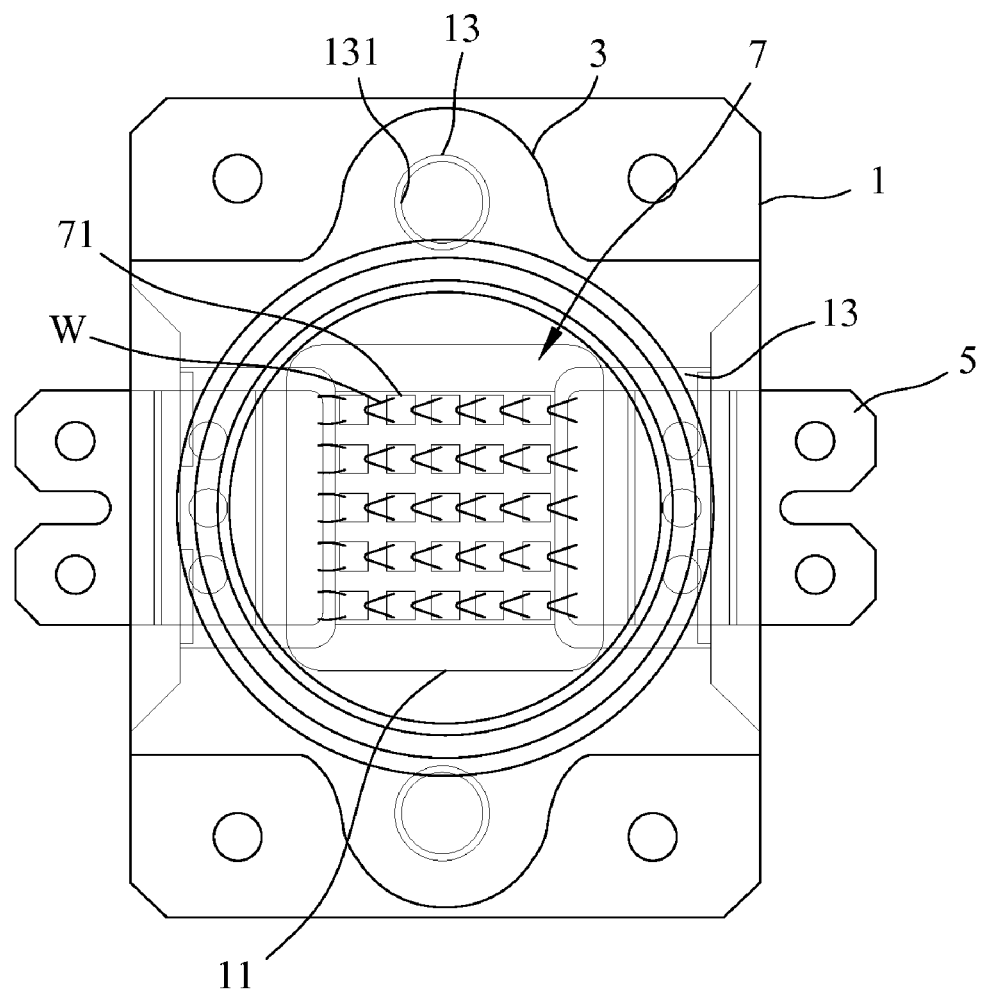
FIG. 5 is a top view of the multi-layer LED array engine according to an embodiment of the present invention.

FIG. 5 is a top view of the multi-layer LED array engine according to an embodiment of the present invention. Referring to FIG. 5, the light element 7 is positioned at the lighting area 11. The lighting element 7 includes a plurality of LED dice 71. The LED dice 71 are wire bonded with a plurality of bonded wires W for electrically connecting the LED dice 71 and the lead frame 5 together to form a complete circuit. The LED dice 71 are preferably arranged in an array form on the upper surface of the lighting area 11. The protection layer 8 is preferably a thin layer of transparent silicon epoxy coated on the wire bonded LED dice 71 for providing a protection to the LED dice 71. The phosphorous layer 9 is formed with a phosphorous compound confined within a space defined by the phosphorous wall 98. The phosphorous wall 98 is configured with an inclined angle in a range of 30° to 60° relative to the lighting area 11. The phosphorous wall 98 is configured surrounding the lighting area 11.

The dome 10 is formed is preferably formed on top of the lighting element 7 by executing an injection molding process. The dome 10 is configured as a transparent silicon lens for converging a light passing therethrough. The dome 10 includes an extended plug 101 and a protruded stick 1011. The extended plug 101 is configured at a bottom and an outer edge of the dome 10. The protruded stick 1011 is configured beneath the extended plug 101. The protruded stick 1011 is adapted for correspondingly fitting in the dome embedded groove 3311a for securing the dome 10 to the molded platform 3. According to an aspect of the embodiment, the length of the extended plug 101 is equivalent to the length of the internal surface 331 of the top molded platform 31. The dome 10 is made of a silicon gel having an optimal light transparency.

The protruded stick 1011 at the bottom of the dome 10 is adapted to exactly fit into the dome embedded groove 3311a. The extended plug 101 also tightly fits to the internal surface 331. In such a way, the dome 10 is very firmly and strongly combined to the molded platform 3. Therefore, external electrical connection can be coupled to the solder holes 53 of the lead frame 5 (not shown in drawings). When an external power supply is provided, the LED Dice 71 can be driven for emitting light. Since the LED dice 71 are arranged in an array form, the light emitted therefrom is intensified. When the light passes through the phosphorous layer 9, light of desired colors can be obtained.

Figure 7:
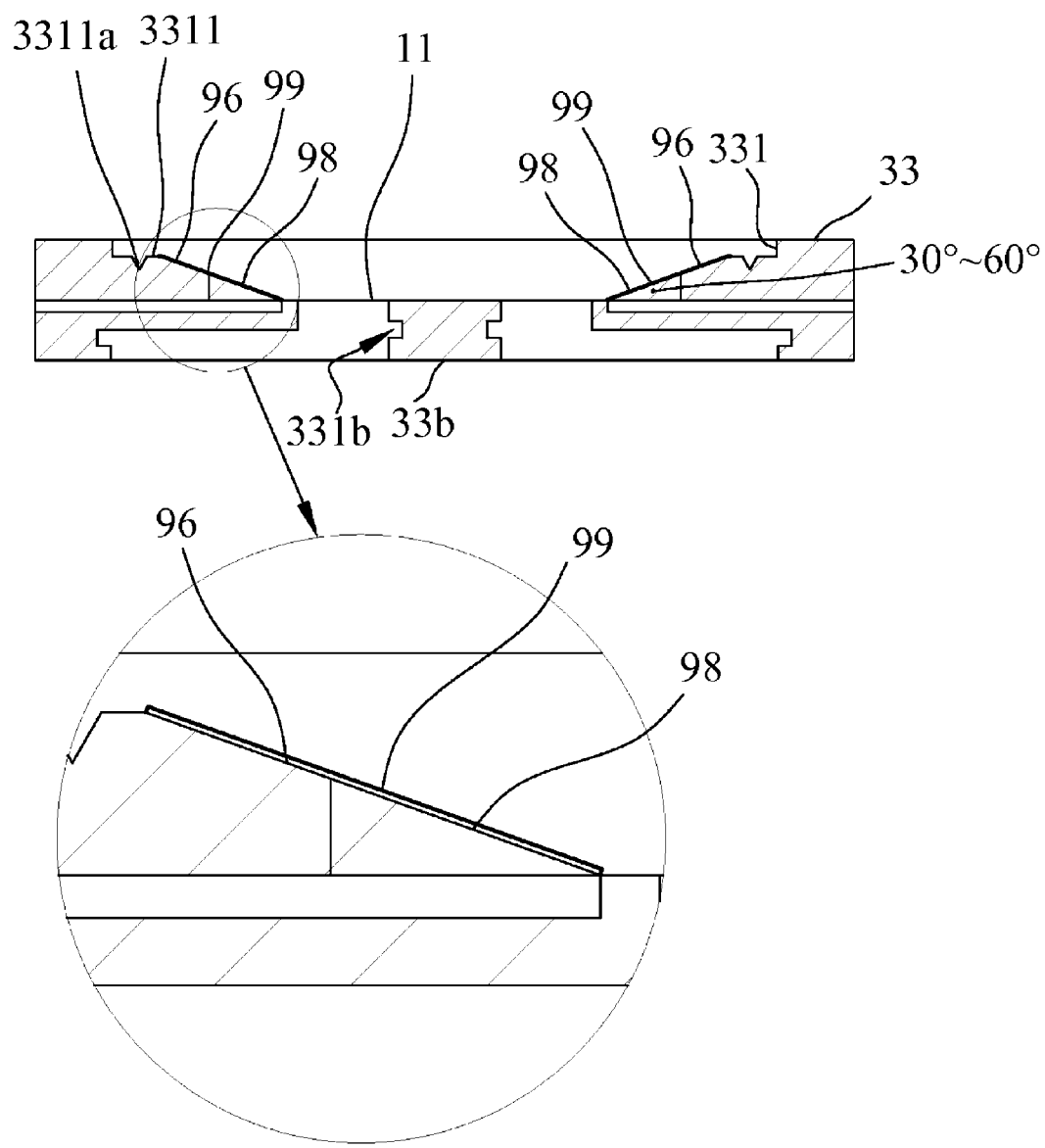
FIG. 7 illustrates a metal reflector cap disposed on an optical reflectivity surface and a phosphorous wall according to a further embodiment of the present invention.

FIG. 7 illustrates a metal reflector cap 99 disposed on the optical reflective surface 96 and the phosphorous wall 98 according to a further embodiment of the present invention. Referring to FIG. 7, there is illustrated an alternative embodiment of the present invention, in which the metal reflector cap 99 plated with a nickel or chromium coating is disposed on the optical reflective surface 96 and the phosphorous wall 98.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A multi-layer light emitting diode (LED) array engine, comprising:
a base plate frame comprising at least one lighting area and two lead frame grooves, wherein the lighting area is located at a center of the base plate frame, and the two lead frame grooves are positioned at a front side and a rear side of the base plate frame, wherein the base plate frame further comprises at least one first locking hole and at least one through hole configured at each of a left side and a right side of the base plate frame, and at least two dented grooves corresponding to each of the two lead frame grooves;
a molded platform, formed by conducting an injection molding process on the base plate frame surrounding the lighting area, an upper part of the molded platform which is higher in height than the lighting area being defined as a top molded platform, wherein the top molded platform comprises a front protruded plate and a back protruded plate, the front protruded plate and the back protruded plate are correspondingly positioned in accommodating spaces defined in the two lead frame grooves, respectively, and each of the front protruded plate and the back protruded plate is configured extending beyond the corresponding lead frame groove, wherein at a far end of each of the front protruded plate and the back protruded plate, each of the front protruded plate and the back protruded plate further extends downwardly and configures a first protruded part, wherein the first protruded part extends parallel with an upper surface of the top molded platform and back towards toward the center of the base plate frame, and configures a protruded block, wherein the protruded blocks are adapted for being correspondingly assembled to the dented grooves, and wherein the top molded platform further comprises a second protruded part positioned corresponding to the first locking hole, and the second protruded part is adapted for being correspondingly assembled to the first locking hole of the base plate frame, wherein the top molded platform comprises a top flat surface, an internal surface, a locking surface and an optical reflective surface, wherein the top flat surface is a flat surface portion positioned at an upper side and a periphery of the top molded platform, the top flat surface comprises an inner edge coupled to the internal surface of the top molded platform, the internal surface is substantially perpendicular with the top flat surface, and the internal surface comprises a bottom edge coupled to the locking surface of the top molded platform, wherein the bottom edge of the internal surface is substantially perpendicular to the locking surface, and the locking surface is parallel to the top flat surface;
two lead frames, partially buried and sealed inside the front protruded plate and the back protruded plate, wherein each lead frame comprises an inner end positioned adjacent to the lighting area and adapted for internal electrical connection, a center part adapted for wire bonding and sealed inside the protruded plate, and an outer end positioned apart away from the lighting area and not sealed by the front protruded plate and the back protruded plate for external electrical connection, wherein each lead frame comprises at least one second locking hole and at least one second locking-in groove between the inner end and the outer end, wherein the second locking-in groove and the second locking hole are buried and sealed inside the molded platform, while the inner end of the lead frame and the outer end of the lead frame are reserved unsealed by the molded platform for wire bonding and electrical connection, wherein a plurality of solder holes are configured at the outer end of the lead frame for electrical connection with external components, and the outer end of the lead frame is configured extending out beyond a peripheral edge of the base plate frame for external electrical connection;
a lighting element disposed on the lighting area, wherein the light element comprises a plurality of LED dice, and the LED dice are wire bonded together and wire bonded to the lead frames for forming a circuit;
a dome, made of a transparent silicon epoxy by executing an injection molding process, the dome covering the molded platform and the lighting element, for protecting the lighting element, wherein the dome comprises an extended plug configured at a bottom edge of the dome, and a protruded stick configured beneath the extended plug for interlocking with the dome embedded groove;
a protection layer coated on the LED dice and the bonded wires; and a phosphorous layer formed on the protection layer, wherein the phosphorous layer is formed by providing a phosphorous compound within a range defined by the phosphorous wall.

2. The multi-layer LED array engine as claimed in claim 1, wherein the base plate frame further comprises a dented groove configured corresponding to each of the two lead frame grooves, respectively, and the two lead frames are positioned in side accommodating spaces defined within the two lead frame grooves, wherein the two lead frames remain noncontact with the base plate frame.

3. The multi-layer LED array engine as claimed in claim 1, wherein the base plate frame is made of a material selected from the group consisting of copper, aluminum, copper alloy, and aluminum alloy.

4. The multi-layer LED array engine as claimed in claim 1, wherein a first locking groove is configured surrounding the lighting area.

5. The multi-layer LED array engine as claimed in claim 4, wherein the first locking groove has a V-shaped cross-section.

6. The multi-layer LED array engine as claimed in claim 1, wherein the second locking-in groove has a V-shaped cross-section.

7. The multi-layer LED array engine as claimed in claim 1, wherein the base plate frame is plated with a nickel coating or a silver coating.

8. The multi-layer LED array engine as claimed in claim 1, wherein an upper surface of the lead frame is positioned not lower than an upper surface of the lighting area.

9. The multi-layer LED array engine as claimed in claim 1, wherein the dome embedded groove has a V-shaped cross-section.

10. The multi-layer LED array engine as claimed in claim 1, wherein the extended plug has a length not shorter than a length of the internal surface of the top molded platform.

11. The multi-layer LED array engine as claimed in claim 1, wherein the LED dice are arranged in an array form on the lighting area.

12. The multi-layer LED array engine as claimed in claim 1, wherein the protection layer is a thin layer of light transparent silicon epoxy disposed for protecting the LED dice and the bonded wire.

13. The multi-layer LED array engine as claimed in claim 1, wherein the phosphorous compound is mixed silicon, and provided within the range defined by the phosphorus wall, wherein the phosphorous wall is configured with an inclined angel in a range of 30° to 60° surrounding the lighting area.

14. The multi-layer LED array engine as claimed in claim 1, wherein the optical reflective surface and the phosphorous wall are coated with a nickel or chromium thin film.

15. The multi-layer LED array engine as claimed in claim 1, wherein a metal reflector cap is seated on the optical reflective surface and the phosphorous wall, wherein the metal reflector cap is coated with a nickel or chromium thin film and has a better light reflectivity than the optical reflective surface and the phosphorous wall.

16. The multi-layer LED array engine as claimed in claim 1, wherein the phosphorous wall is formed with an inclined angle in a range of 30° to 60° related to the upper surface of the lighting area.

17. The multi-layer LED array engine as claimed in claim 1, wherein the optical reflective surface is formed with an inclined angle in a range of 30° to 60° related to the upper surface of the lighting area.

18. The multi-layer LED array engine as claimed in claim 1, wherein the dome is made of a silicon gel.

19. The multi-layer LED array engine as claimed in claim 1, wherein the dome serves as an optical lens for converging a light passing therethrough.

* * * * *